United States Patent
Jo et al.

(10) Patent No.: US 10,026,794 B2
(45) Date of Patent: Jul. 17, 2018

(54) DISPLAY DEVICE HAVING AN INSULATING PATTERN COVERED VIA AND ELECTRODE HOLES

(71) Applicant: LG DISPLAY CO., LTD., Seoul (KR)

(72) Inventors: Daegyu Jo, Seoul (KR); Wonsang Ryu, Goyang-si (KR); Youngkyu Song, Incheon (KR); Dongchae Shin, Goyang-si (KR); Seungeun Pyo, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/366,725

(22) Filed: Dec. 1, 2016

(65) Prior Publication Data
US 2017/0154936 A1    Jun. 1, 2017

(30) Foreign Application Priority Data
Dec. 1, 2015  (KR) .................. 10-2015-0169919

(51) Int. Cl.
| | |
|---|---|
| *H01L 27/32* | (2006.01) |
| *G02F 1/13* | (2006.01) |
| *G02F 1/1362* | (2006.01) |
| *H01L 27/12* | (2006.01) |
| *H01L 51/52* | (2006.01) |

(52) U.S. Cl.
CPC ........ *H01L 27/3258* (2013.01); *G02F 1/1362* (2013.01); *H01L 27/3248* (2013.01); *H01L 27/3276* (2013.01); *H01L 27/3297* (2013.01); *H01L 27/1244* (2013.01); *H01L 27/1248* (2013.01); *H01L 51/5253* (2013.01)

(58) Field of Classification Search
CPC ............ H01L 27/3258; H01L 27/3248; H01L 27/3276; H01L 27/3297; G02F 1/1362
See application file for complete search history.

(56) References Cited

U.S. PATENT DOCUMENTS

| | | | | |
|---|---|---|---|---|
| 8,071,978 | B2 * | 12/2011 | Park | H01L 27/3262 257/59 |
| 9,291,841 | B2 * | 3/2016 | Bae | H01L 27/1248 |
| 2009/0233393 | A1 * | 9/2009 | Jung | G02F 1/133707 438/30 |
| 2012/0146971 | A1 * | 6/2012 | Yoon | G02F 1/13439 345/205 |

(Continued)

FOREIGN PATENT DOCUMENTS

| | | |
|---|---|---|
| EP | 1939674 A2 | 7/2008 |
| EP | 1968118 A2 | 9/2008 |
| EP | 2814074 A1 | 12/2014 |

*Primary Examiner* — Ida M Soward
(74) *Attorney, Agent, or Firm* — Birch, Stewart, Kolasch & Birch, LLP

(57) ABSTRACT

A display device is discussed. The display device according to an embodiment includes a substrate, a display region disposed over the substrate and including a plurality of subpixels, and a data pad part disposed in regions other than the display region. The data pad part includes a data signal line extended from the display region, an insulating film disposed on the data signal line and insulating the data signal line, a data pad electrode disposed on the insulating film and connected to the data signal line through the via hole, and an insulating pattern configured to cover the via hole. The data pad electrode can include at least one electrode hole.

11 Claims, 12 Drawing Sheets

(56) References Cited

U.S. PATENT DOCUMENTS

| | | |
|---|---|---|
| 2012/0153813 A1 | 6/2012 | Shin et al. |
| 2012/0299888 A1 | 11/2012 | Kim et al. |
| 2013/0001563 A1 | 1/2013 | Park et al. |
| 2013/0026476 A1 | 1/2013 | Park et al. |
| 2015/0108452 A1 | 4/2015 | Park et al. |
| 2015/0287750 A1 | 10/2015 | Youn et al. |
| 2016/0013436 A1* | 1/2016 | Im .................. H01L 51/5206 257/40 |
| 2016/0026049 A1* | 1/2016 | Park .................. H01L 27/124 257/72 |
| 2016/0056223 A1* | 2/2016 | Bower ............... H01L 27/3255 257/40 |

\* cited by examiner

FIG. 16

| Structure | Experiment example 2 | Experiment example 3 |
|---|---|---|
| Figure | 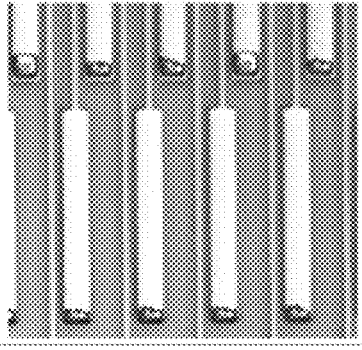 | 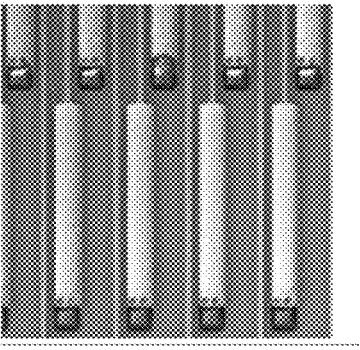 |
| Results | Insulating pattern peeled off. Some insulating pattern remains on data pad electrode. | Insulating pattern peeled off. No peeling at interface of insulating film. |
| Cause | Increased contact area between insulating pattern and data pad electrode | Excellent adhesion force between insulating film and insulating pattern |

DISPLAY DEVICE HAVING AN INSULATING PATTERN COVERED VIA AND ELECTRODE HOLES

CROSS-REFERENCE TO RELATED APPLICATION

This application claims the priority benefit of Korean Patent Application No. 10-2015-0169919 filed on Dec. 1, 2015, which is incorporated herein by reference for all purposes as if fully set forth herein.

BACKGROUND OF THE INVENTION

Field of the Invention

The present disclosure relates to a display device.

Discussion of the Related Art

Various flat display devices capable of reducing weight and volume, that is, disadvantages of a cathode ray tube (CRT), have recently been developed. Examples of such flat display devices include a liquid crystal display (LCD) device, a field emission display (FED), a plasma display panel (PDP) and an organic light-emitting display (OLED). Among them, the organic light-emitting display is a self-emission display that emits light by exciting an organic compound, and enables lightness and thinness because it does not require backlight unit used in an LCD and can simplify the process. Furthermore, the OLED can be fabricated at a low temperature, has a fast response time of 1 ms or less, and has characteristics, such as low consumption power, a wide viewing angle, and high contrast.

The organic light-emitting display generally includes a light-emitting layer made of an organic substance between a first electrode, that is, the anode, and a second electrode, that is, the cathode. Holes supplied from the first electrode and electrons supplied from the second electrode are combined in the light-emitting layer to form exciton, that is, hole-electron pairs. Light is emitted by energy generated when the exciton returns to the ground state.

The organic light-emitting display is partitioned into a display region including a plurality of pixels and displaying an image and a non-display region, that is, a region other than the display region. A data pad part for applying a data driving signal to the plurality of pixels is disposed in the non-display region. The data pad part includes a plurality of wires extending from the display region. A plurality of pad electrodes is connected to the plurality of wires through contact holes. In order to prevent a pad electrode from being lost due to subsequent process in a contact hole region, an insulating film covering the contact hole region is disposed.

However, the insulating film that covers the contact hole region has a problem in that it is peeled off because an adhesive force is weakened depending on a layer coming into contact with the bottom of the insulating film. Accordingly, there are problems in that a defect occurs in the connection with a data driving part because a pad electrode disposed in the contact hole region is lost and reliability of the organic light-emitting display is deteriorated.

SUMMARY OF THE INVENTION

Accordingly, the present disclosure has been made keeping in mind the above problems occurring in the related art, and an object of the present disclosure is to provide a display device capable of improving reliability of an organic light-emitting display by preventing an insulating film from being peeled off in a data pad part.

An embodiment of the present disclosure provides a display device comprising a substrate; a display region disposed over the substrate and comprising a plurality of subpixels; and a data pad part disposed in regions other than the display region, wherein the data pad part comprises: a data signal line extended from the display region; an insulating film disposed on the data signal line and insulating the data signal line, wherein the insulating film includes a via hole which has partially exposed the data signal line; a data pad electrode disposed on the insulating film and connected to the data signal line through the via hole; and an insulating pattern configured to cover the via hole, wherein the data pad electrode includes at least one electrode hole.

In one or more embodiment, the electrode hole exposes the insulating film which is disposed under the data pad electrode. At least part of the electrode hole overlaps the insulating pattern. The insulating pattern comes into contact with the insulating film through the electrode hole. The electrode hole fully overlaps the insulating pattern. The electrode hole is spaced apart from an edge of the data pad electrode. The electrode hole is formed in a dot form. At least part of the electrode hole overlaps the via hole. An area of the electrode hole is 5% to 95% with respect to an area 100% in which the data pad electrode and the insulating pattern overlap.

In one or more embodiments, each of the subpixels comprises a thin film transistor disposed over the substrate; a planarization film disposed over the thin film transistor and exposing a part of the thin film transistor; a first electrode disposed on the planarization film and connected to the thin film transistor; a light-emitting layer disposed on the first electrode; and a second electrode disposed on the light-emitting layer.

The insulating pattern and the planarization film can be formed of the same material.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 16 is an image showing a defect in an insulating pattern according to the structures of experiment examples 2 and 3.

DETAILED DESCRIPTION OF THE EMBODIMENTS

Figure 1:
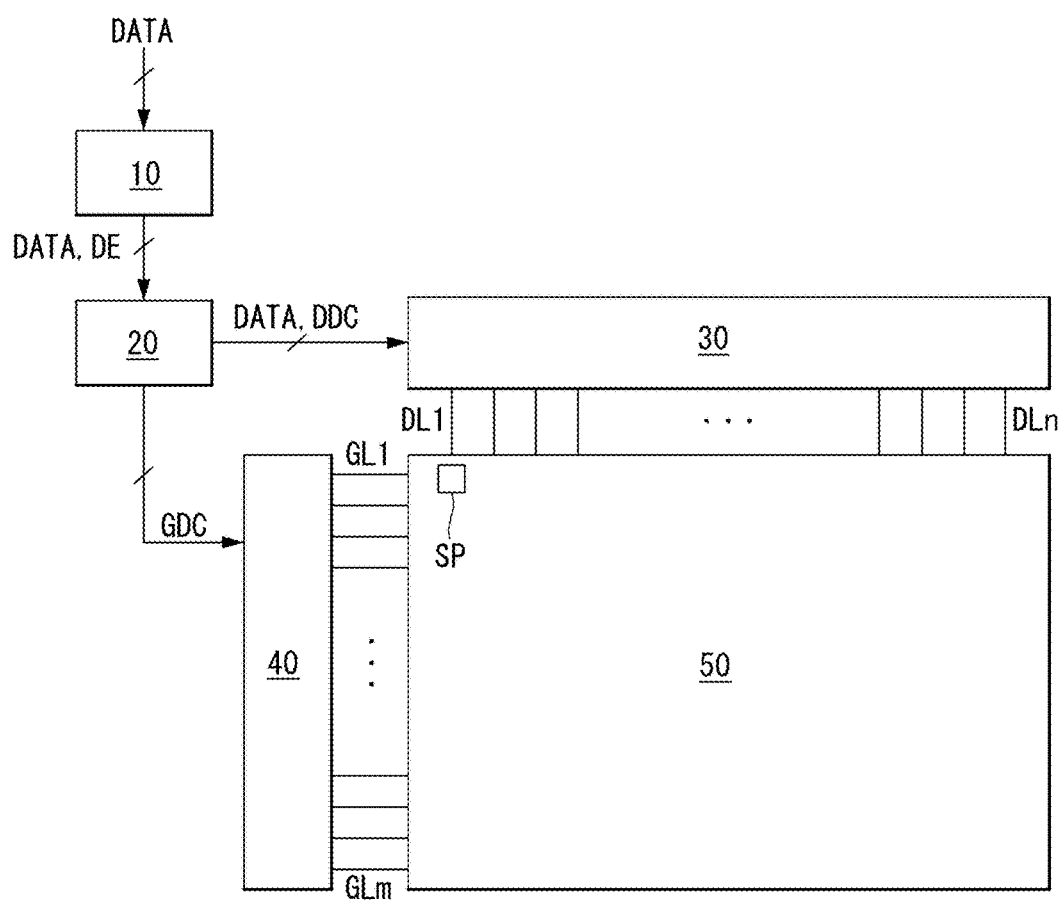
FIG. 1 is a schematic block diagram of an organic light-emitting display according to an embodiment of the present disclosure.

Hereinafter, some embodiments of the present disclosure are described in detail with reference to the accompanying drawings. In the specification, the same reference numerals denote substantially the same elements. In the following description, a detailed description of the known functions and elements will be omitted if it is deemed to make the gist of the present disclosure unnecessarily vague. Furthermore, the names of the elements used in the following description have been selected by taking into consideration only the ease of writing this specification and may be different from the names of actual parts.

A display device according to an embodiment of the present disclosure is a plastic display device in which a display element has been formed on a flexible plastic substrate. Examples of the plastic display device may include an organic light-emitting display, an LCD, and an electrophoresis display device. In an embodiment of the present disclosure, an organic light-emitting display is described as an example. An organic light-emitting display includes a light-emitting layer made of an organic substance between a first electrode, that is, the anode, and a second electrode, that is, the cathode. Holes supplied from the first electrode and electrons supplied from the second electrode are combined in the light-emitting layer to form exciton, that is, hole-electron pairs. Light is emitted by energy generated when the exciton returns to the ground state. An organic light-emitting display according to an embodiment of the present disclosure may be formed in a glass substrate in addition to the plastic substrate.

Embodiments of the present disclosure are described below with reference to the accompanying drawings.

Figure 2:
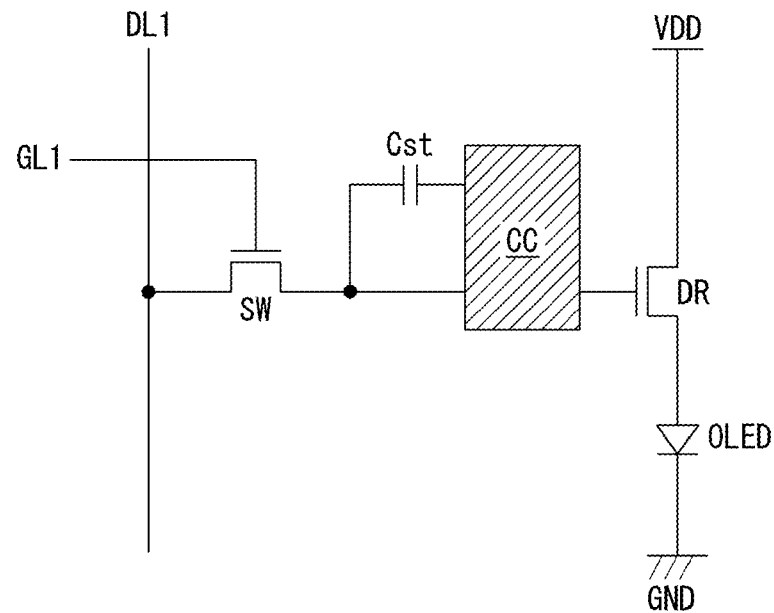
FIG. 2 is a diagram showing a first example of the circuit configuration of a subpixel of FIG. 1.
Figure 3:
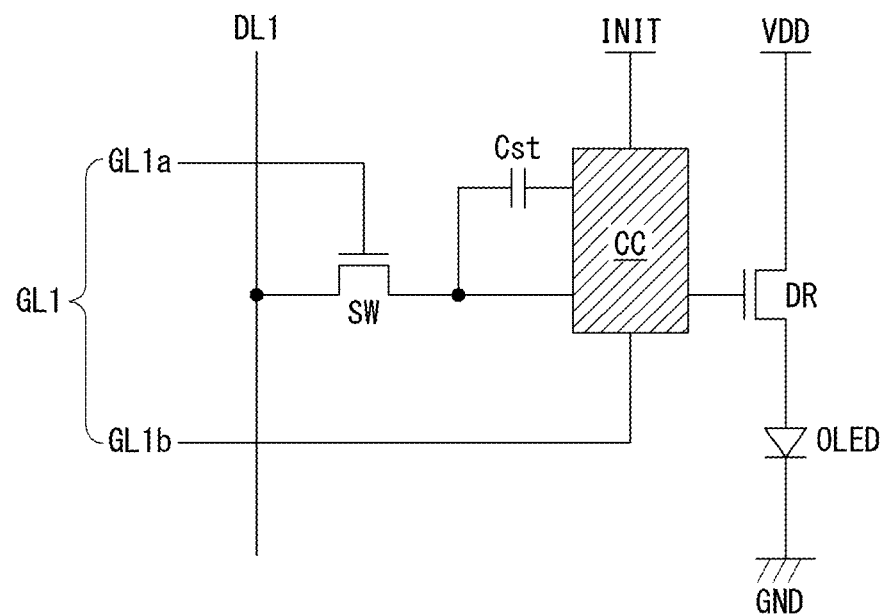
FIG. 3 is a diagram showing a second example of the circuit configuration of a subpixel of FIG. 1.
Figure 4:
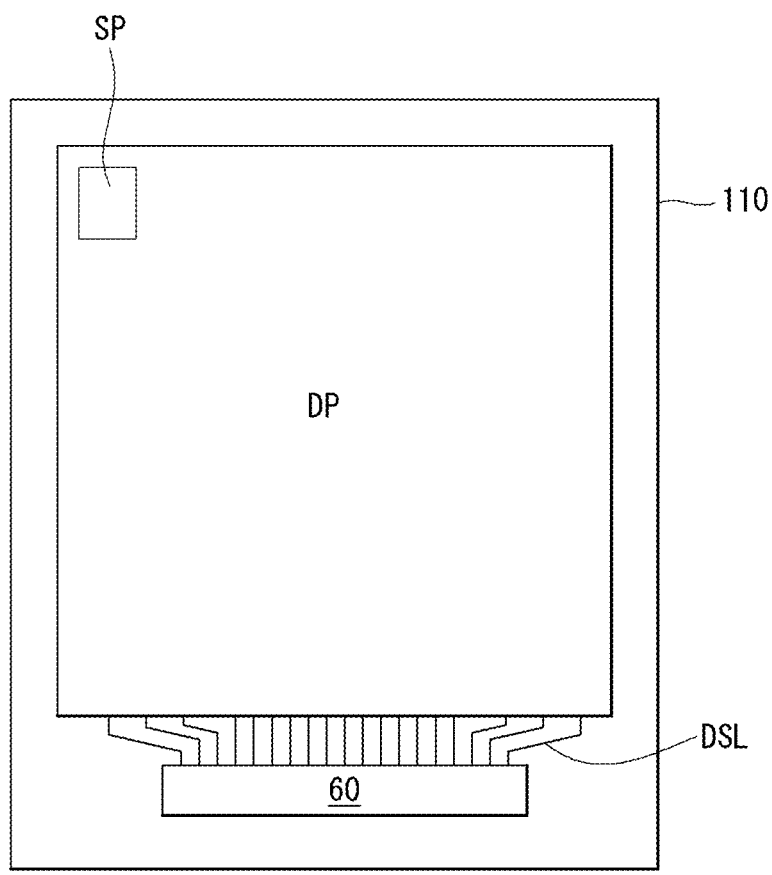
FIG. 4 is a plan view showing an organic light-emitting display according to an embodiment of the present disclosure.
Figure 5:
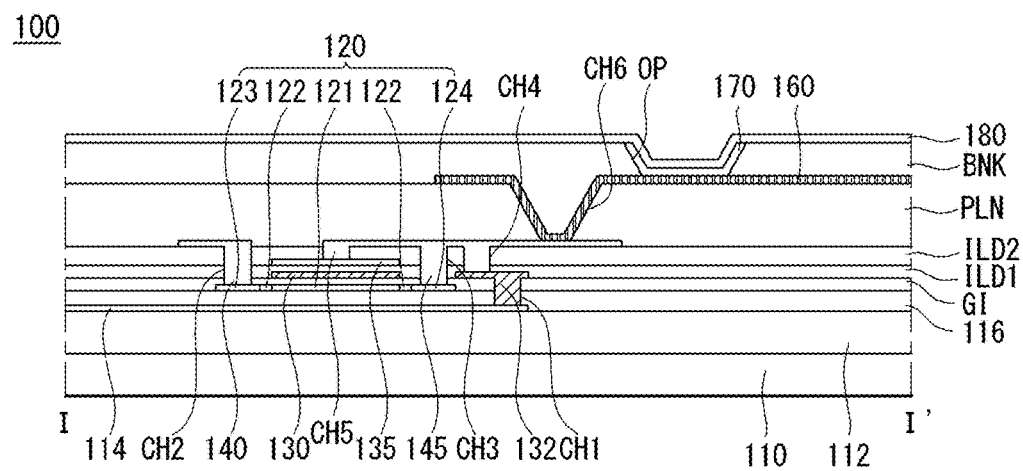
FIG. 5 is a cross-sectional view showing a subpixel of an organic light-emitting display according to an embodiment of the present disclosure.

FIG. 1 is a schematic block diagram of an organic light-emitting display according to an embodiment of the present disclosure. FIG. 2 is a diagram showing a first example of the circuit configuration of a subpixel of the organic light-emitting display according to the present disclosure. FIG. 3 is a diagram showing a second example of the circuit configuration of a subpixel of the organic light-emitting display according to the present disclosure. FIG. 4 is a plan view showing an organic light-emitting display according to an embodiment of the present disclosure. FIG. 5 is a cross-sectional view showing a subpixel of the organic light-emitting display. All the components of the organic light-emitting display according to all embodiments of the present disclosure are operatively coupled and configured.

Referring to FIG. 1, the organic light-emitting display includes an image processing part 10, a timing control part 20, a data driving part 30, a gate driving part 40, and a display panel 50.

The image processing part 10 outputs a data enable signal DE along with an external data signal DATA. The image processing part 10 may output one or more of a vertical sync signal, a horizontal sync signal, and a clock signal in addition to the data enable signal DE. The vertical sync signal, horizontal sync signal, and clock signal may not be shown, for convenience of description. The image processing part 10 is formed in a system circuit substrate in an integrated circuit (IC) form.

The timing control part 20 is supplied with the data signal DATA from the image processing part 10 along with the data enable signal DE or driving signals, including the vertical sync signal, horizontal sync signal, and clock signal.

The timing control part 20 outputs a gate timing control signal GDC for controlling operating timing of the gate driving part 40 and a data timing control signal DDC for controlling operating timing of the data driving part 30 based on the driving signal. The timing control part 20 is formed in a control circuit substrate in an IC form.

The data driving part 30 samples and latches the data signal DATA, supplied by the timing control part 20, in response to the data timing control signal DDC supplied by the timing control part 20, converts the latched signal into a gamma reference voltage, and outputs the gamma reference voltage. The data driving part 30 outputs the data signal DATA through data lines DL1~DLn. The data driving part 30 is attached to the substrate in an IC form.

The gate driving part 40 outputs a gate signal while shifting the level of a gate voltage in response to the gate timing control signal GDC supplied by the timing control part 20. The gate driving part 40 outputs the gate signal through gate lines GL1~GLm. The gate driving part 40 is formed in a gate circuit substrate in an IC form or formed in the display panel 50 in a gate-in panel form.

The display panel 50 displays an image in response to the data signal DATA and the gate signal supplied by the data driving part 30 and the gate driving part 40. The display panel 50 includes a plurality of subpixels SP for displaying an image.

Referring to FIG. 2, each subpixel SP can include a switching transistor SW, a driving transistor DR, a compensation circuit CC, and an organic light-emitting diode (OLED). The OLED operates to emit light in response to a driving current formed by the driving transistor DR.

The switching transistor SW performs a switching operation so that a data signal supplied through the first data line DL1 is stored in a capacitor Cst as a data voltage in response to a gate signal supplied through the first gate line GL1. The driving transistor DR operates so that a driving current flows between a high potential power line VDD and a low potential power line GND depending on the data voltage stored in the capacitor Cst. The compensation circuit CC functions to compensate for the threshold voltage of the driving transistor DR. Furthermore, the capacitor connected to the switching transistor SW or the driving transistor DR may be disposed within the compensation circuit CC.

The compensation circuit CC includes one or more TFTs and capacitors. The compensation circuit CC may have various constructions depending on compensation methods, and a detailed example and description thereof are omitted.

Furthermore, as shown in FIG. 3, if the compensation circuit CC is included, each subpixel further includes a signal line and a power line for supplying a specific signal or power while driving a compensation TFT. The added signal line may be defined as a (1-2) gate line GL1b for driving the compensation TFT of the subpixel. Furthermore, the added power line may be defined as an initialization power line INIT for resetting a specific node of the subpixel to a specific voltage. However, this is only an example, and the present disclosure is not limited thereto.

In FIGS. 2 and 3, the compensation circuit CC has been illustrated as being included in one subpixel. However, if the subject of compensation is disposed outside a subpixel as in the data driving part 30, the compensation circuit CC may be omitted. That is, one subpixel basically has a 2 transistor (2T) 1 capacitor (1C) structure, including the switching transistor SW, the driving transistor DR, the capacitor, and the OLED. If the compensation circuit CC is added, however, a subpixel may have various structures, such as 3T1C, 4T2C, 5T2C, 6T2C, and 7T2C.

Furthermore, in FIGS. 2 and 3, the compensation circuit CC has been illustrated as being disposed between the switching transistor SW and the driving transistor DR. In some embodiments, a compensation circuit CC may be further disposed between the driving transistor DR and the OLED. The position and structure of the compensation circuit CC are not limited to FIGS. 2 and 3.

Referring to FIG. 4, the display panel of an organic light-emitting display includes a substrate 110, a display region DP, a data pad part 60, and data signal lines DSL.

The data pad part 60 is formed on the lower side of the substrate 110. The data pad part 60 is a pad region to which a data driving part is attached. The data pad part 60 is connected to a data circuit substrate on which the data driving part is mounted or a control circuit substrate on which a timing control part is mounted, for example.

The data signal lines DSL supply a data signal to subpixels SP formed in the display region DP. The data signal lines DSL receive the data signal from the data driving part and transfers the data signal from the data pad part 60 to the subpixels SP. The data signal lines DSL are connected to pad electrodes in the data pad part 60. The pad electrodes are connected to the data driving part, which is described later in detail.

Referring to FIG. 5, an organic light-emitting display 100 according to an embodiment of the present disclosure includes a first buffer layer 112 disposed on a substrate 110. The substrate 110 is made of glass, plastic or metal. In an embodiment of the present disclosure, the substrate 110 is made of plastic. More specifically, the substrate 110 may be a polyimide substrate. Accordingly, the substrate 110 according to an embodiment of the present disclosure has a flexible characteristic. The first buffer layer 112 functions to protect a thin film transistor (TFT) formed in a subsequent process against impurities, such as alkali ions drained from the substrate 110. The first buffer layer 112 may be a silicon oxide (SiOx) layer, a silicon nitride (SiNx) layer or a multiple layer of them.

A shield layer 114 is disposed on the first buffer layer 112. The shield layer 114 functions to prevent a reduction of a panel driving current which may be generated because the polyimide substrate is used. A second buffer layer 116 is disposed on the shield layer 114. The second buffer layer 116 functions to protect the TFT formed in a subsequent process from impurities, such as alkali ions drained from the shield layer 114. The second buffer layer 116 may be a silicon oxide (SiOx) layer, a silicon nitride (SiNx) layer or a multiple layer of them.

A semiconductor layer 120 is disposed on the second buffer layer 116. The semiconductor layer 120 may be made of a silicon semiconductor or an oxide semiconductor. The silicon semiconductor may include amorphous silicon or crystallized polycrystallin silicon. The polycrystalline silicon may be applied to a gate driver for driving element and/or a multiplexer (MUX) or a TFT within a pixel because it has high mobility of 100 $cm^2/Vs$ or more, low consumption power, and excellent reliability. The oxide semiconductor is suitable for a switching TFT having a short on time and long off time because it has a low off current. Furthermore, the oxide semiconductor is suitable for a display device that requires low speed driving and/or low consumption power because it has a low off current and has a long voltage retention time for a pixel. Furthermore, the semiconductor layer 120 includes a drain region 123 and source region 124 including p type or n type impurities, and includes a channel 121 between the drain region 123 and the source region 124. Furthermore, the semiconductor layer 120 includes a low-concentration doping region 122 between the drain region 123 and the source region 124 adjacent to the channel 121.

A gate insulating film GI is disposed on the semiconductor layer 120. The gate insulating film GI may be a silicon oxide (SiOx) layer, a silicon nitride (SiNx) layer or a multiple layer of them. A first gate electrode 130 is disposed in a specific region of the semiconductor layer 120 on the gate insulating film GI, that is, a position corresponding to the channel 121 when impurities are implanted. The first gate electrode 130 acts as the gate electrode of the driving transistor DR. The first gate electrode 130 is made of any one selected from the group consisting of molybdenum (Mo), aluminum (Al), chrome (Cr), gold (Au), titanium (Ti), nickel (Ni), neodymium (Nd), and copper (Cu) or an alloy of them. In some embodiments, the first gate electrode 130 may be a multiple layer made of any one selected from the group consisting of molybdenum (Mo), aluminum (Al), chrome (Cr), gold (Au), titanium (Ti), nickel (Ni), neodymium (Nd), and copper (Cu) or an alloy of them. For example, the gate electrode 130 may be a dual layer of molybdenum/aluminum-neodymium or molybdenum/aluminum.

A connection electrode 132 is disposed on one side of the first gate electrode 130. The connection electrode 132 is connected to the gate insulating film GI and the shield layer 114 through a first contact hole CH1 that penetrates the second buffer layer 116.

A first interlayer dielectric film ILD1 for the insulation of the first gate electrode 130 is disposed on the first gate electrode 130. The first interlayer dielectric film ILD1 may be a silicon oxide (SiOx) layer, a silicon nitride (SiNx) layer or a multiple layer of them. A second gate electrode 135 is disposed on the first interlayer dielectric film ILD1. The second gate electrode 135 is a capacitor electrode that forms a capacitor along with the first gate electrode 130, and does not function as the gate electrode of the driving transistor DR. A second interlayer dielectric film ILD2 for the insulation of the second gate electrode 135 is disposed on the second gate electrode 135. Second and third contact holes CH2 and CH3 through which part of the semiconductor layer 120 is exposed are disposed in some region of the second interlayer dielectric film ILD2, the first interlayer dielectric film ILD1, and the gate insulating film GI. The drain region 123 of the semiconductor layer 120 is exposed through the second contact hole CH2, and the source region 124 of the semiconductor layer 120 is exposed through the third contact hole CH3. Furthermore, a fourth contact hole CH4 through which the connection electrode 132 is exposed is formed in some region of the second interlayer dielectric film ILD2 and the first interlayer dielectric film ILD1. Furthermore, a fifth contact hole CH5 through which the second gate electrode 135 is exposed is disposed in some region of the second interlayer dielectric film ILD2.

A drain electrode 140 and a source electrode 145 are disposed on the second interlayer dielectric film ILD2. The drain electrode 140 is connected to the semiconductor layer 120 through the second contact hole CH2 through which the drain region 123 of the semiconductor layer 120 is exposed. The source electrode 145 is connected to the semiconductor layer 120 through the third contact hole CH3 through which the source region 124 of the semiconductor layer 120 is exposed. Furthermore, the source electrode 145 penetrates the second interlayer dielectric film ILD2 and the first interlayer dielectric film ILD1, and it is connected to the connection electrode 132 through the fourth contact hole CH4 through which the connection electrode 132 is exposed and connected to the second gate electrode 135 through the fifth contact hole CH5. The source electrode 145 and the drain electrode 140 may be a single layer or a multiple layer. If the source electrode 145 and the drain electrode 140 are formed of a single layer, they may be made of any one selected from the group consisting of molybdenum (Mo), aluminum (Al), chrome (Cr), gold (Au), titanium (Ti), nickel (Ni), neodymium (Nd), and copper (Cu) or an alloy of them. Furthermore, if the source electrode 145 and the drain electrode 140 are formed of a multiple layer, they may be a dual layer of molybdenum/aluminum-neodymium or a triple layer of titanium/aluminum/titanium, molybdenum/aluminum/molybdenum or molybdenum/aluminum neodymium/molybdenum.

Accordingly, a driving transistor DR, including the semiconductor layer 120, the first gate electrode 130, the drain electrode 140, and the source electrode 145, is formed.

A planarization film PLN is disposed over the substrate 110 including the driving transistor DR. The planarization film PLN may be a planarization film for reducing the step of an underlying structure, and is made of an organic substance, such as polyimide, benzocyclobutene-series resin or acrylate. The planarization film PLN may be formed by a method, such as spin-on glass (SOG) for coating an organic substance in a liquid form and the curing it.

A sixth contact hole CH6 through which the source electrode 145 is exposed is formed in some region of the planarization film PLN. A first electrode 160 is formed on the planarization film PLN. The first electrode 160 functions as a pixel electrode and is connected to the source electrode 145 of the driving transistor DR through the sixth contact hole CH6. The first electrode 160 is the anode and may be made of a transparent conductive material, such as indium tin oxide (ITO), indium zinc oxide (IZC) or zinc oxide (ZnO). If the first electrode 160 is a reflection electrode, the first electrode 160 includes a reflection layer. The reflection layer may be made of aluminum (Al), copper (Cu), silver (Ag) or nickel (Ni) or an alloy of them. More specifically, the reflection layer may be made of an alloy of silver/palladium/copper (APC).

A bank layer BNK for partitioning pixels is disposed over the substrate 110 including the first electrode 160. The bank layer BNK is made of an organic substance, such as polyimide, benzocyclobutene-series resin or acrylate. An open portion OP through which the first electrode 160 is exposed is disposed in the bank layer BNK. A light-emitting layer 170 coming into contact with the first electrode 160 is disposed in the open portion OP of the bank layer BNK. The light-emitting layer 170 is a layer in which electrons and holes are combined to emit light. A hole injection layer or hole transport layer may be disposed between the light-emitting layer 170 and the first electrode 160. An electron transport layer or electron injection layer may be disposed on the light-emitting layer 170.

A second electrode 180 is disposed on the light-emitting layer 170. The second electrode 180 is disposed on the entire surface of a display part A/A and is a cathode electrode. The second electrode 180 may be made of magnesium (Mg), calcium (Ca), aluminum (Al) or silver (Ag) having a low work function or an alloy of them. If the second electrode 180 is a transmission electrode, it has a thin thickness to the extent that the second electrode 180 can transmit light. If the second electrode 180 is a reflection electrode, it has a thick thickness to the extent that light can be reflected from the second electrode 180.

The organic light-emitting display according to an embodiment of the present disclosure may have a limitation in that the insulating film is peeled off in the data pad part. A data pad part according to an embodiment of the present disclosure is described in detail below.

First Embodiment

Figure 6:
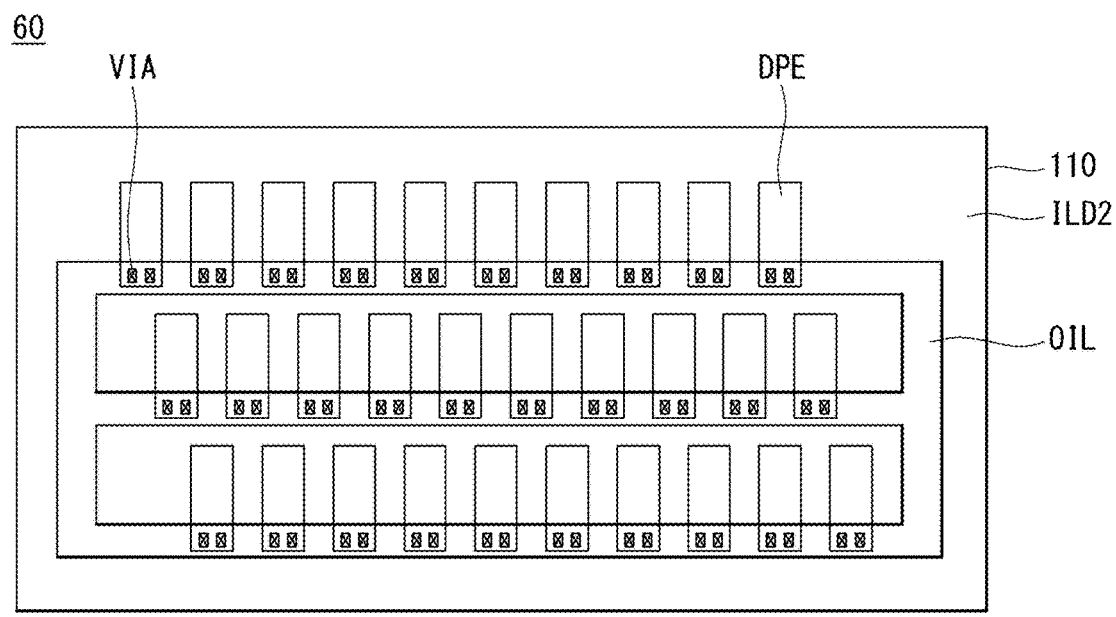
FIG. 6 is a plan view of a first embodiment showing the data pad part of the organic light-emitting display shown in FIG. 4.
Figure 7:
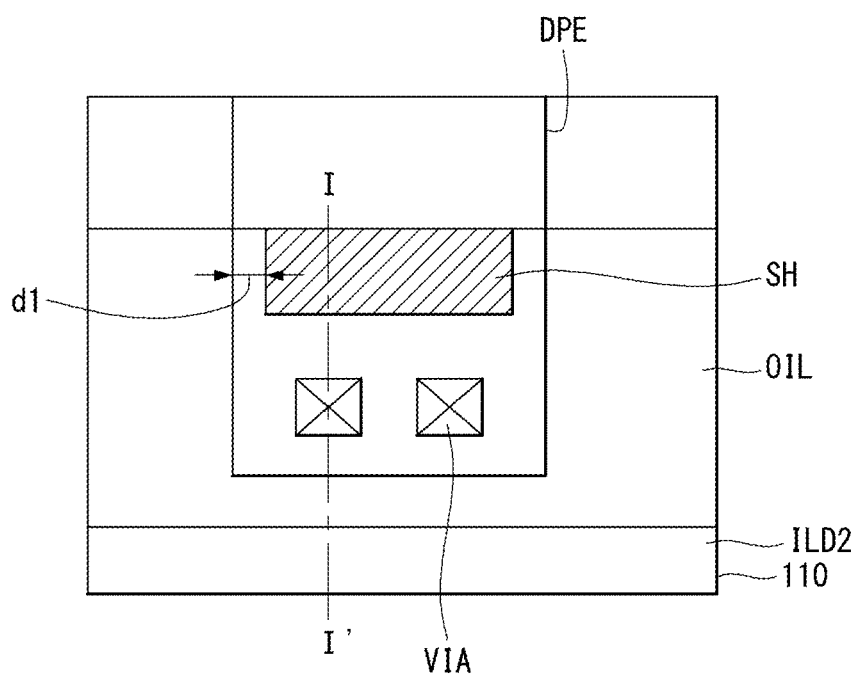
FIGS. 7 to 9 are plan views showing an enlarged view of part of the data pad part shown in FIG. 6.
Figure 8:
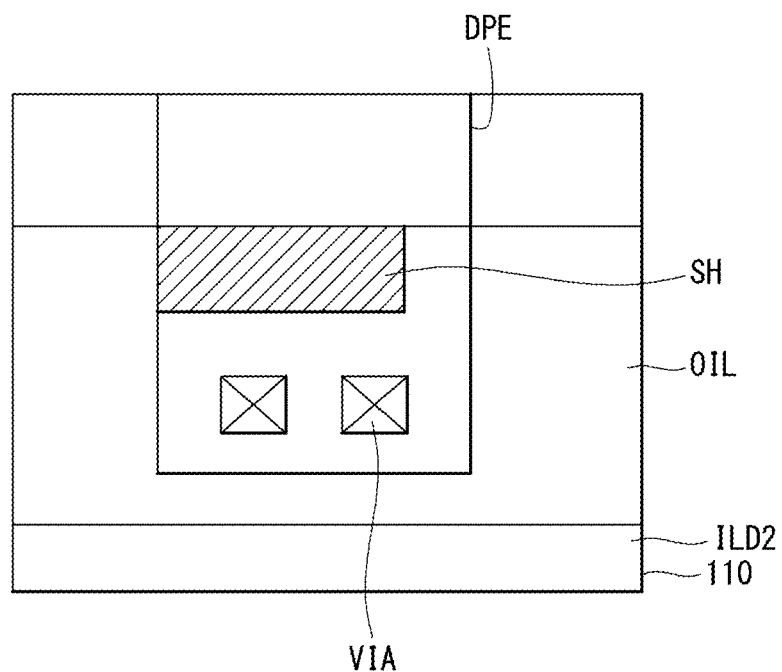
Figure 9:
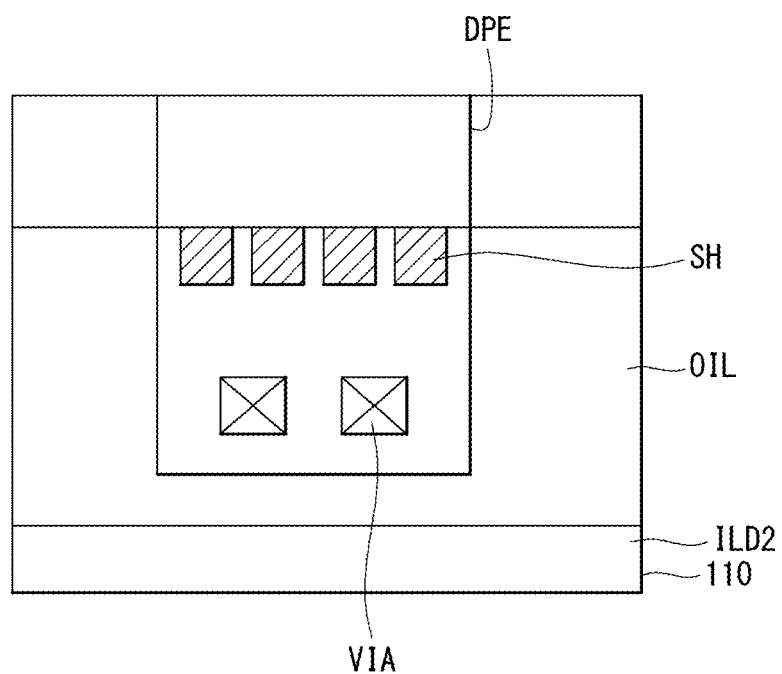
Figure 10:
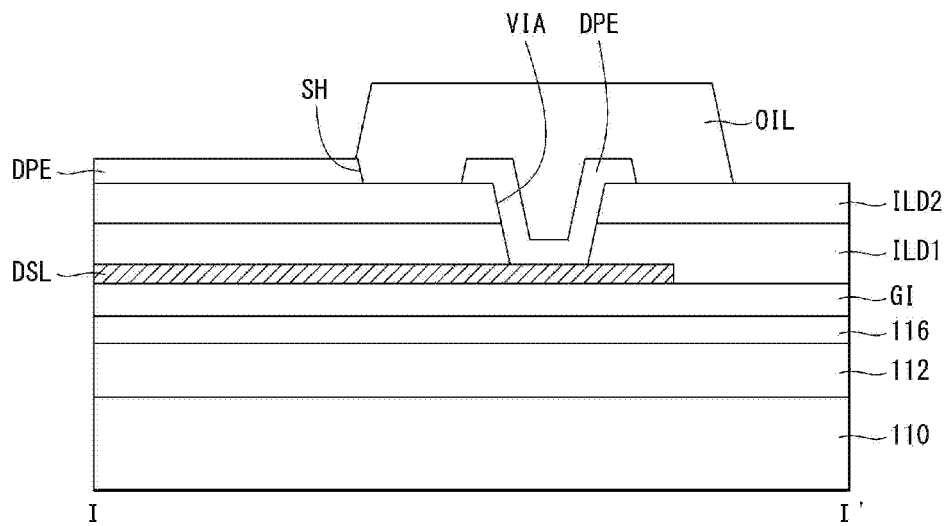
FIG. 10 is a cross-sectional view taken along line I-I' of FIG. 7.

FIG. 6 is a plan view of a first embodiment showing the data pad part of the organic light-emitting display shown in FIG. 4. FIGS. 7 to 9 are plan views showing an enlarged view of part of the data pad part shown in FIG. 6. FIG. 10 is a cross-sectional view taken along line I-I' of FIG. 7.

Referring to FIG. 6, data pad electrodes DPE connected to data signal lines DSL extended from the display region of the substrate 110 are disposed in the data pad part 60 of the organic light-emitting display. The data pad electrodes DPE are disposed in a plurality of rows and columns on the second interlayer dielectric film ILD2 formed on the substrate 110, and thus secure the spaces so that the data signal lines extended from the display region do not overlap. Further, the data signal lines extended from the display region are disposed under the second interlayer dielectric film ILD2 in accordance with the data pad electrodes DPE. The data pad electrodes DPE are connected to the data signal lines through via holes VIA that penetrate the second interlayer dielectric film ILD2.

An insulating pattern OIL is disposed on the region in which the via holes VIA are disposed. The insulating pattern OIL is formed by the same process as that of the planarization film of the display region. When all of the via holes VIA are covered with the insulating pattern OIL, the data pad electrodes DPE disposed on the via holes VIA are also covered. When the data pad electrodes DPE disposed in the via holes VIA are covered with the insulating pattern OIL, part of the data pad electrodes DPE can be prevented from being lost from the via holes VIA in subsequent processes.

Referring to FIGS. 7 to 10, the first buffer layer 112, the second buffer layer 116, and the gate insulating film GI are disposed on the substrate 110. The data signal line DSL is disposed on the gate insulating film GI. The data signal line DSL is formed by the same process as that of the first gate electrode of the display region. The first interlayer dielectric film ILD1 and the second interlayer dielectric film ILD2 are sequentially stacked on the data signal line DSL. The via hole VIA penetrating the first interlayer dielectric film ILD1 and the second interlayer dielectric film ILD2 is formed in the first interlayer dielectric film ILD1 and the second interlayer dielectric film ILD2. The data pad electrode DPE is formed on the second interlayer dielectric film ILD2. The data pad electrode DPE is connected to the data signal line DSL through the via hole VIA.

The data pad electrode DPE according to an embodiment of the present disclosure has an electrode hole SH formed in some region overlapping the insulating pattern OIL. The electrode hole SH is formed by etching the data pad electrode DPE, and functions to expose the underlying second interlayer dielectric film ILD2 so that the second interlayer dielectric film ILD2 comes into contact with the insulating pattern OIL. The insulating pattern OIL is formed of an organic film like the planarization film, and an adhesive force between the insulating pattern OIL and metal, such as the data pad electrode DPE, is reduced. In this case, if the insulating pattern OIL is formed on the data pad electrode DPE, the insulating pattern OIL is easily peeled off. In particular, if a step is formed in the data pad electrode DPE, an adhesive force between the insulating pattern OIL and the data pad electrode DPE is reduced in the region in which the step has been formed.

In an embodiment of the present disclosure, the second interlayer dielectric film ILD2 having an excellent adhesive force with the insulating pattern OIL is bonded to the insulating pattern OIL because the electrode hole SH is formed in the data pad electrode DPE so that the second interlayer dielectric film ILD2 is exposed through the electrode hole SH. Accordingly, the insulating pattern OIL and the second interlayer dielectric film ILD2 are bonded together in some region, thus preventing an adhesive force between the data pad electrode DPE and the insulating pattern OIL over the data pad electrode DPE from being reduced.

The electrode hole SH of the data pad electrode DPE is spaced apart from the edge of an adjacent data pad electrode DPE at an interval of a specific distance "d1." The electrode hole SH functions to enhance an adhesive force between the data pad electrode DPE and the insulating pattern OIL, and thus the data pad electrode DPE and the insulating pattern OIL may be present at least in the periphery of the electrode hole SH. In another embodiment, as shown in FIG. 8, the electrode hole SH may be formed to lean toward one side of an adjacent data pad electrode DPE. For example, the electrode hole SH may be formed to have a shape that disconnects a connection on one side of the data pad electrode DPE. In yet another embodiment of the present disclosure, as shown in FIG. 9, a plurality of the electrode holes SH may be formed. In this case, each of the electrode holes SH may have a dot form. In the embodiments of the present disclosure, the number or shape of the electrode holes SH is not limited. Any means may be used if the data pad electrode DPE has only to be exposed through the means so that the second interlayer dielectric film ILD2 can come into contact with the insulating pattern OIL.

In an embodiment of the present disclosure, the insulating pattern OIL may be formed to cover the entire electrode hole SH formed in the data pad electrode DPE so that an adhesion area between the insulating pattern OIL and the second interlayer dielectric film ILD2 is maximized. However, the present disclosure is not limited to such an embodiment. The insulating pattern OIL may be formed to cover part of the electrode hole SH as in a second embodiment.

Second Embodiment

Figure 11:
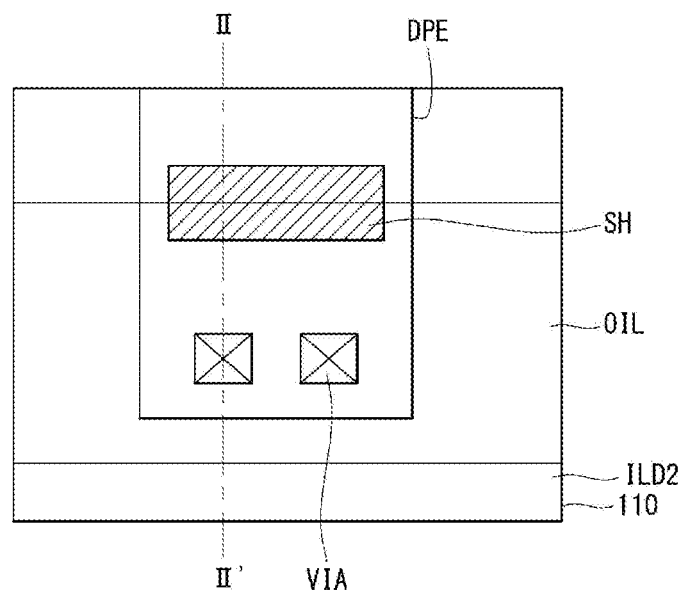
FIG. 11 is a plan view showing an enlarged view of part of the data pad part shown in FIG. 6.
Figure 12:
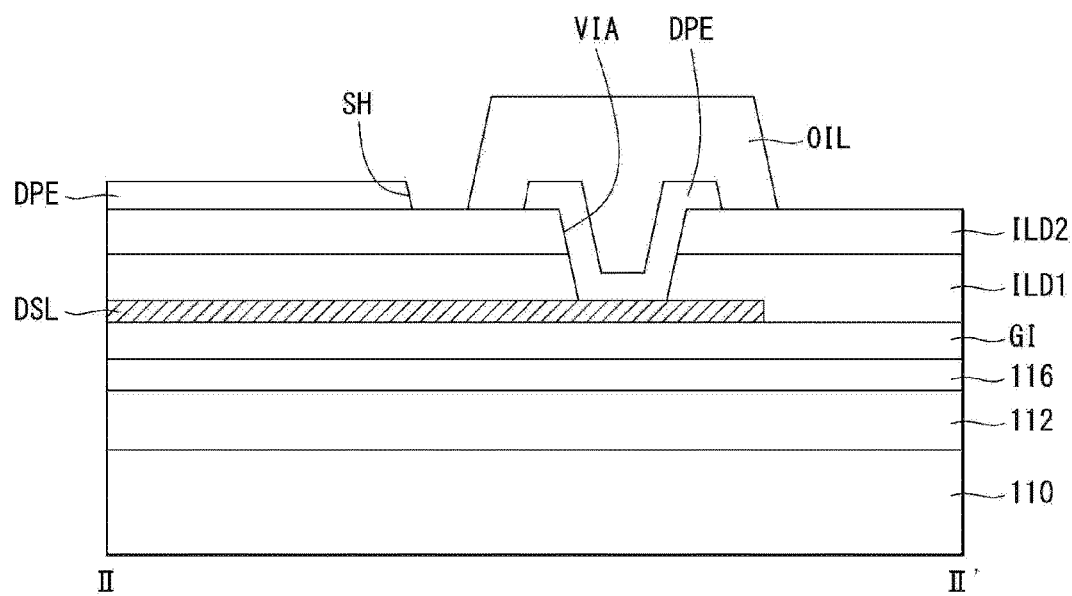
FIG. 12 is a cross-sectional view taken along line II-II' of FIG. 11.

FIG. 11 is a plan view showing an enlarged view of part of the data pad part shown in FIG. 6. FIG. 12 is a cross-sectional view taken along line II-II' of FIG. 11.

Referring to FIGS. 11 and 12, the data pad electrode DPE according to an embodiment of the present disclosure includes the electrode hole SH. The insulating pattern OIL is disposed on the data pad electrode DPE, but only part of the electrode hole SH may be covered with the insulating pattern OIL. Structures in which only part of the electrode hole SH is covered with the insulating pattern OIL include a structure in which the size of the insulating pattern OIL is fixed and the electrode hole SH of the data pad electrode DPE is moved to the upper side in the figure and a structure in which the position of the electrode hole SH of the data pad electrode DPE is fixed and the size of the insulating pattern OIL is reduced. Any structure may be applied to an embodiment of the present disclosure if the insulating pattern OIL and the second interlayer dielectric film ILD2 may be brought into contact with each other through the electrode hole SH of the data pad electrode DPE.

The second embodiment of the present disclosure can provide a process margin by which the electrode hole SH and the insulating pattern OIL can overlap by providing the structure in which at least part of the electrode hole SH is covered with the insulating pattern OIL.

In another embodiment of the present disclosure, the electrode hole SH may be disposed to overlap the via hole VIA.

Third Embodiment

Figure 13:
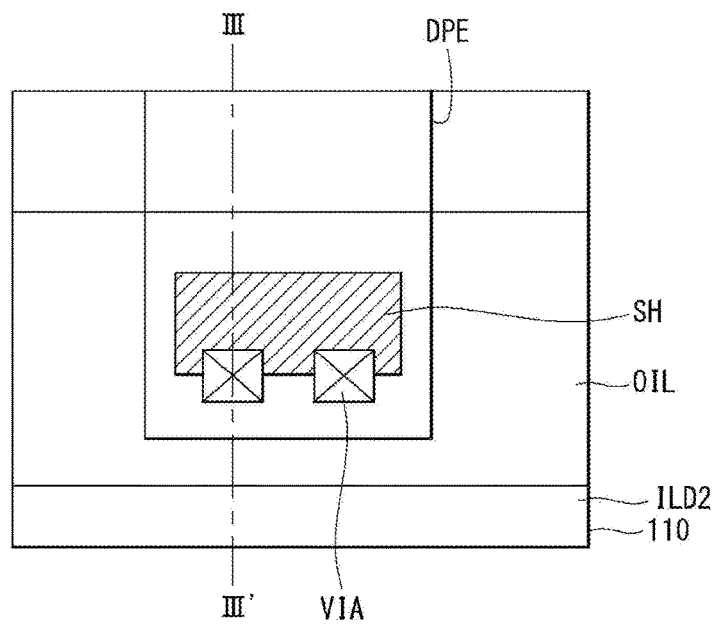
FIG. 13 is a plan view showing an enlarged view of part of the data pad part shown in FIG. 6.
Figure 14:
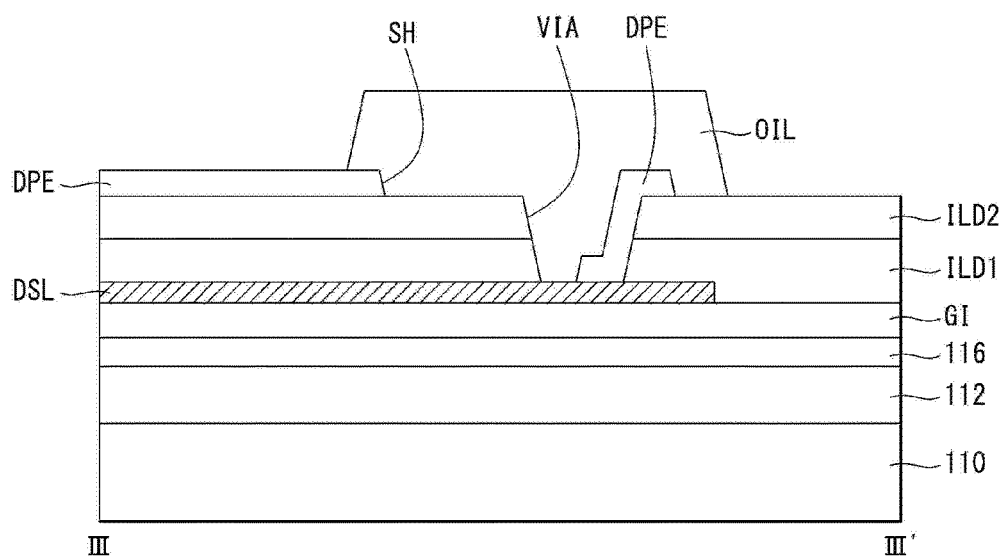
FIG. 14 is a cross-sectional view taken along line III-III' of FIG. 13.

FIG. 13 is a plan view showing an enlarged view of part of the data pad part shown in FIG. 6. FIG. 14 is a cross-sectional view taken along line III-III' of FIG. 13.

Referring to FIGS. 13 and 14, the data pad electrode DPE according to an embodiment of the present disclosure includes the electrode hole SH. The electrode hole SH formed in the data pad electrode DPE overlaps the via hole VIA formed in the first and the second interlayer dielectric films ILD1 and ILD2. At least part of the electrode hole SH, for example, the entire electrode hole SH may be covered with the insulating pattern OIL formed on the data pad electrode DPE. The structure according to the third embodiment of the present disclosure discloses that the size of the electrode hole SH is maximized as much as possible, but the data pad electrode DPE and the data signal line DSL are brought into contact with each other at the least. Accordingly, an adhesive force between the insulating pattern OIL and the second interlayer dielectric film ILD2 can be maximized.

In the present embodiment, an area of the electrode hole SH may be 5% to 95% with respect to an area 100% in which the data pad electrode DPE and the insulating pattern OIL overlap. If the size of the electrode hole SH is 5% or more with respect to the area 100% in which the data pad electrode DPE and the insulating pattern OIL overlap, an adhesive force between the insulating pattern OIL and the second interlayer dielectric film ILD2 can be improved because the contact area of the insulating pattern OIL and the second interlayer dielectric film ILD2 is widened. If the size of the electrode hole SH is 95% or less with respect to the area 100% in which the data pad electrode DPE and the insulating pattern OIL overlap, an increase of contact resistance between the data pad electrode DPE and the data signal line DSL can be prevented because a minimum contact area between the data pad electrode DPE and the data signal line DSL is secured.

As described above, in the organic light-emitting displays according to the first to third embodiments of the present disclosure, the second interlayer dielectric film under the data pad electrode and the insulating pattern are brought into contact with each other because the electrode hole is formed in the data pad electrode disposed in the data pad part. Accordingly, the insulating pattern can be prevented from being peeled off in the data pad electrode in the periphery of the electrode hole because an adhesive force between the insulating pattern and the second interlayer dielectric film is enhanced. Accordingly, reliability of a connection between the data driving part and the data pad electrode in the data pad part of the organic light-emitting display can be improved.

Experiment examples of the organic light-emitting display according to an embodiment of the present disclosure are disclosed below.

Figure 15:
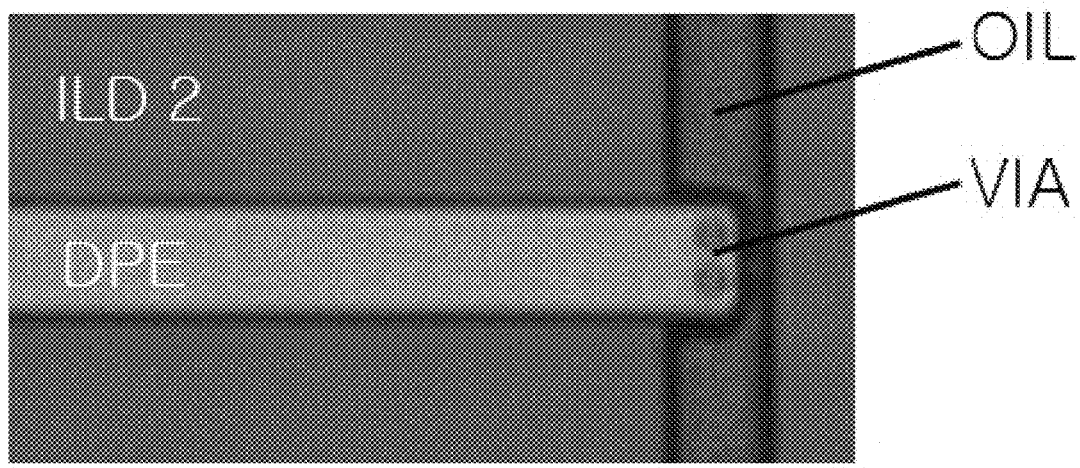
FIG. 15 is an image showing a defect in an insulating pattern according to the structure of an experiment example 1.

FIG. 15 is an image showing a defect in an insulating pattern according to the structure of an experiment example 1. FIG. 16 is an image showing a defect in an insulating pattern according to the structures of experiment examples 2 and 3.

In the experiment example 1, the insulating pattern OIL was formed in a line form in the region in which the data pad electrode DPE and the via hole VIA overlapped. In the experiment example 2, the insulating pattern OIL was formed in an island pattern only in the region in which the data pad electrode DPE and the via hole VIA overlapped. In the experiment example 3, the insulating pattern OIL was also formed on the second interlayer dielectric film ILD2 that neighbors the region in which the data pad electrode DPE and the via hole VIA overlapped. Furthermore, the organic light-emitting displays were fabricated by performing all of subsequent processes, and the data pad part regions were measured using an optical camera.

FIG. 15 shows that in the experiment example 1, the insulating pattern OIL was fully peeled off on the entire top surface of the data pad electrode DPE. FIG. 16 shows that in the experiment example 2, the insulating pattern OIL formed on top of the data pad electrode DPE was partially peeled off and in the experiment example 3, the insulating pattern OIL formed on top of the data pad electrode DPE was partially peeled off, but the insulating pattern OIL formed on the second interlayer dielectric film ILD2 was not peeled off.

Through the experiment examples, the inventors of the present disclosure noticed that the insulating pattern could be prevented from being peeled off by adhesion between the insulating pattern and the second interlayer dielectric film because the second interlayer dielectric film was exposed by forming the electrode hole within the data pad electrode.

As described above, in the organic light-emitting displays according to the first to third embodiments of the present disclosure, the electrode hole is formed in the data pad electrode disposed in the data pad part so that the second interlayer dielectric film under the data pad electrode and the insulating pattern are brought into contact with each other. Accordingly, the insulating pattern can be prevented from being peeled off in the data pad electrode in the periphery of the electrode hole because an adhesive force between the insulating pattern and the second interlayer dielectric film is enhanced. Accordingly, reliability of a connection between the data driving part and the data pad electrode in the data pad part of the organic light-emitting display can be improved.

Although the embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art

What is claimed is:

1. A display device, comprising:
    a substrate;
    a display region disposed over the substrate and comprising a plurality of subpixels; and
    a data pad part disposed in regions other than the display region,
    wherein the data pad part comprises:
        a data signal line extended from the display region;
        an insulating film disposed on the data signal line and insulating the data signal line, the insulating film including a via hole which has partially exposed the data signal line;
        a data pad electrode disposed on the insulating film and connected to the data signal line through the via hole; and
        an insulating pattern configured to cover the via hole, and
    wherein the data pad electrode comprises at least one electrode hole.

2. The display device of claim 1, wherein the electrode hole exposes the insulating film which is disposed under the data pad electrode.

3. The display device of claim 2, wherein at least part of the electrode hole overlaps the insulating pattern.

4. The display device of claim 3, wherein the insulating pattern comes into contact with the insulating film through the electrode hole.

5. The display device of claim 3, wherein the electrode hole fully overlaps the insulating pattern.

6. The display device of claim 1, wherein the electrode hole is spaced apart from an edge of the data pad electrode.

7. The display device of claim 1, wherein the electrode hole is formed in a dot form.

8. The display device of claim 1, wherein at least part of the electrode hole overlaps the via hole.

9. The display device of claim 1, wherein an area of the electrode hole is 5% to 95% with respect to an area 100% in which the data pad electrode and the insulating pattern overlap.

10. The display device of claim 1, wherein each of the subpixels comprises:
    a thin film transistor disposed over the substrate;
    a planarization film disposed over the thin film transistor and exposing a part of the thin film transistor;
    a first electrode disposed on the planarization film and connected to the thin film transistor;
    a light-emitting layer disposed on the first electrode; and
    a second electrode disposed on the light-emitting layer.

11. The display device of claim 10, wherein the insulating pattern and the planarization film are formed of a same material.

* * * * *